United States Patent
Cho et al.

(10) Patent No.: US 9,543,280 B2
(45) Date of Patent: Jan. 10, 2017

(54) LIGHT EMITTING MODULE AND LIGHTING DEVICE

(71) Applicant: LUMENS CO., LTD., Yongin-si (KR)

(72) Inventors: Yong-Wook Cho, Yongin-Si (KR); Min-Pyo Kim, Yongin-Si (KR); Gun-Ha Kim, Suwon-Si (KR); Jung-Hae Park, Suwon-Si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 15/016,397

(22) Filed: Feb. 5, 2016

(65) Prior Publication Data

US 2016/0233199 A1 Aug. 11, 2016

(30) Foreign Application Priority Data

Feb. 5, 2015 (KR) .................. 10-2015-0018232

(51) Int. Cl.
  *H01L 33/62* (2010.01)
  *H01L 25/075* (2006.01)
  *H01L 33/64* (2010.01)
  *H01L 33/48* (2010.01)

(52) U.S. Cl.
  CPC .......... *H01L 25/0753* (2013.01); *H01L 33/48* (2013.01); *H01L 33/483* (2013.01); *H01L 33/486* (2013.01); *H01L 33/62* (2013.01); *H01L 33/64* (2013.01); *H01L 33/647* (2013.01)

(58) Field of Classification Search
  None
  See application file for complete search history.

(56) References Cited

U.S. PATENT DOCUMENTS

| | | | |
|---|---|---|---|
| 2010/0259930 A1* | 10/2010 | Yan | F21K 9/00 362/235 |
| 2013/0256710 A1* | 10/2013 | Andrews | H01L 25/0753 257/88 |
| 2015/0267906 A1* | 9/2015 | Wilcox | F21V 23/003 362/311.02 |
| 2016/0233401 A1* | 8/2016 | Konishi | H01L 33/60 |

FOREIGN PATENT DOCUMENTS

| | | |
|---|---|---|
| JP | 2013-042099 | 2/2013 |
| KR | 10-1438566 | 9/2014 |

OTHER PUBLICATIONS

Korean Office Action mailed Aug. 29, 2016 from Korean Patent Application No. 10-2015-0018232, 5 pgs.

* cited by examiner

*Primary Examiner* — Minh-Loan Tran
(74) *Attorney, Agent, or Firm* — Ichthus International Law PLLC (57) ABSTRACT

Disclosed herein are a light emitting module and a lighting device that may be used for a display application or a lighting application. The light emitting module includes an electrode layer including a plurality of blocks that are insulated from each other by an electrode separating line; and one or more light emitting elements mounted on the electrode layer so as to be electrically connected to any one block of the blocks of the electrode layer and a neighboring block, respectively, wherein the blocks have another neighboring block disposed in a first direction and still another neighboring block disposed in a second direction, based on any one block of the blocks while having the electrode separating line formed to be bent more than once at a predetermined interval therebetween so that heat generated from the light emitting elements is emitted through the blocks.

12 Claims, 6 Drawing Sheets

LIGHT EMITTING MODULE AND LIGHTING DEVICE

RELATED APPLICATIONS

This application claims priority to Korean Patent Application No.10-2015-0018232, filed on Feb. 5, 2015, which is herein incorporated by reference in its entirety.

BACKGROUND

Field

The present invention relates to a light emitting module and a lighting device, and more particularly, to a light emitting module and a lighting device that may be used for a display application or a lighting application.

Description of the Related Art

A light emitting diode (LED) refers to a kind of semiconductor device capable of implementing light having various colors by configuring a light emitting source by forming a PN diode of a compound semiconductor. The above-mentioned light emitting element has advantages that it has a long lifespan, it may be miniaturized and lightened, and it may be driven at a low voltage. In addition, since the above-mentioned LED has impact resistance and vibration resistance, does not need a preheating time and a complex driving, and is mounted in various forms on a substrate or a lead frame to be then packaged, it may be modularized in various applications and may be applied to a backlight unit, a variety of lighting devices, or the like.

SUMMARY

There were next generation high output light sources using light emitting elements such as a wafer level packaging (WLP), a ceramic laminate package, a multi-chip package, a metal package, a chip on board (COB), and the like.

Among these, a light emitting module that one or more light emitting elements of a chip form are mounted on a substrate is advantageous to improve an output and integrate a device.

However, the above-mentioned light emitting module according to the related art that light emitting elements are mounted on a slim and thin wiring layer formed on the substrate had a problem in that heat dissipation performance is deteriorated due to a narrowed area of the wiring layer.

Further, in the light emitting module according to the related art, in the case in which a solder member is welded to a solder pad, since heat is rapidly discharged into a direction of the wiring layer the instant the solder member contacts the solder pad, a phenomenon that the solder member is cooled before the solder member is evenly spread on the solder pad, a so called solder spread defect phenomenon may occur. Thereby, there is a problem in that it is difficult to perform a soldering and a wire connection.

Further, since excessive heat is transferred through the wiring layer at the time of performing a soldering work for a long time, the light emitting element may be destroyed by thermal damage. Thereby, there was a problem in that reliability and durability of a product are significantly deteriorated.

An object of the present invention is to provide a light emitting module and a lighting device capable of improving heat dissipation performance by forming an electrode layer using a plurality of blocks, preventing a solder spread defect phenomenon by partially blocking heat of a solder pad part transferred to the blocks using an isolation part, and greatly improving reliability and durability of a product by minimizing the heat transferred to the blocks at the time of performing soldering work for a long time. However, the above-mentioned object is only an example, and the present invention is not limited thereto.

According to an exemplary embodiment of the present invention, there is provided a light emitting module including: an electrode layer including a plurality of blocks that are insulated from each other by an electrode separating line; and one or more light emitting elements mounted on the electrode layer so as to be electrically connected to any one block of the blocks of the electrode layer and a neighboring block, respectively, wherein the blocks have another neighboring block disposed in a first direction and still another neighboring block disposed in a second direction, based on any one block of the blocks while having the electrode separating line therebetween so that heat generated from the light emitting elements is emitted through the blocks.

The electrode separating line may start from the outermost surface of the electrode layer with one branch, internally lead to the electrode layer, pass through one or more branch points branched into two branches, traverse the electrode layer, and lead to the outermost other surface of the electrode layer.

The electrode separating line may start from the outermost surface of the electrode layer, internally lead to the electrode layer, pass through one or more right-angled bending points which are bent at an angle of 90°, traverse the electrode layer, and lead to the outermost other surface of the electrode layer.

The block of the electrode layer may be a fitting-type block in which a concave region is formed to correspond to a protrusion region of another neighboring block in a shape fit into the protrusion region.

The electrode layer may further include: a first solder pad part connected to a front block of the blocks and having a solder member bonded thereto; and a second solder pad part connected to a terminal block of the blocks and having the solder member bonded thereto, and an isolation part may be formed between the first solder pad part and the front block or between the second solder pad part and the terminal block, and be partially formed in the remaining portion except for an electrode connecting part for electricity transfer, in order to prevent a solder spread defect phenomenon due to rapid heat emission at the time of welding the solder member.

The isolation part may be formed by selecting any one of a narrow-width circular arc type generally having a circular arc shape and having an interval narrower than a length in a length direction, a broad-width circular arc type generally having a circular arc shape, and of which an inter side end portion is formed in a straight line type so as to widen an interval thereof, a partial circular arc type partially having a circular arc shape, and in which a first straight line part and a second straight line part are formed to widen an interval thereof, and a partial circular arc extension type partially having a circular arc shape, and in which a first straight line part and a second straight line part are formed to widen an interval thereof and an extension part having a shape extended to the first straight line part in one direction thereof is formed. The isolation part may have an interval of 0.1 mm to 2.0 mm, and the electrode connecting part may have an interval of 0.1 mm to 2.5 mm. The solder pad part having a quarter-circular arc shape may have a radius of 2.5 mm to 7.0 mm.

The electrode layer may include a central region on which the plurality of light emitting elements are intensively mounted and a border region surrounding around the central region, and the block includes a heat absorbing part positioned on the central region and a heat dissipating part extended from the heat absorbing part and led to the border region.

The blocks of the electrode layer may include a first column blocks starting from the first solder pad part and disposed in a first column; and a second column blocks connected to the first column of the first column blocks and disposed in a second column, so that electricity flows in a zigzag through the plurality of light emitting elements from the first solder pad part and then flows into the second solder pad part.

The light emitting module may further include: a metal substrate supporting the electrode layer; an insulating layer installed on the metal substrate; a charging member charged in the electrode separating line of the electrode layer; a reflecting layer having a light emitting element accommodating hole formed therein and formed on the electrode layer; and a guide part formed on the reflecting layer and formed around the light emitting element accommodating hole to guide a position of a lens or phosphor at the time of forming the lens or the phosphor.

According to another exemplary embodiment of the present invention, there is provided a lighting device including: an electrode layer including a plurality of blocks that are insulated from each other by an electrode separating line; and one or more light emitting elements mounted on the electrode layer so as to be electrically connected to any one block of the blocks of the electrode layer and a neighboring block, respectively, wherein the blocks have another neighboring block disposed in a first direction and still another neighboring block disposed in a second direction, based on any one block of the blocks while having the electrode separating line therebetween so that heat generated from the light emitting elements is emitted through the blocks.

DETAILED DESCRIPTION

Hereinafter, exemplary embodiments of the present invention will be described in detail with reference to the accompanying drawings.

Exemplary embodiments of the present invention are provided in order to more completely explain the present invention to those skilled in the art. The following exemplary embodiments may be modified in several different forms and do not limit a scope of the present invention. Rather, these exemplary embodiments are provided in order to make this disclosure more thorough and complete and completely transfer ideas of the present invention to those skilled in the art. In addition, a thickness or a size of each layer on the drawing will be exaggerated for convenience of explanation and clarity.

Figure 1:
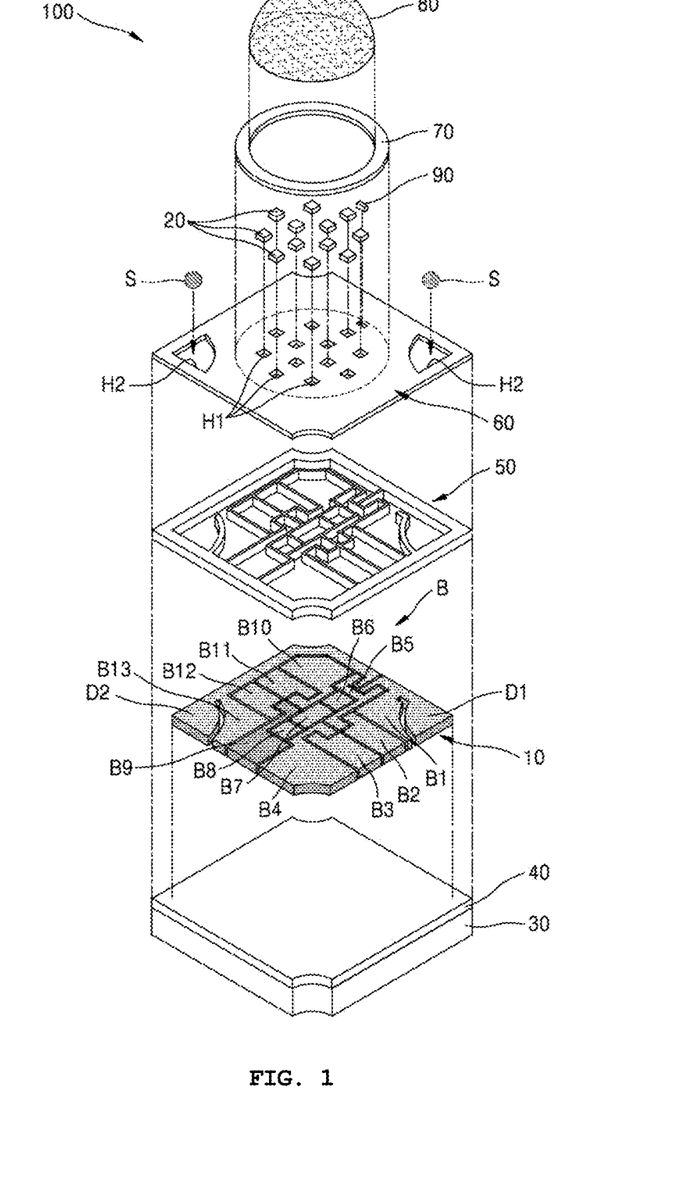
FIG. 1 is an exploded perspective view of a component illustrating a light emitting module according to exemplary embodiments of the present invention.
Figure 2:
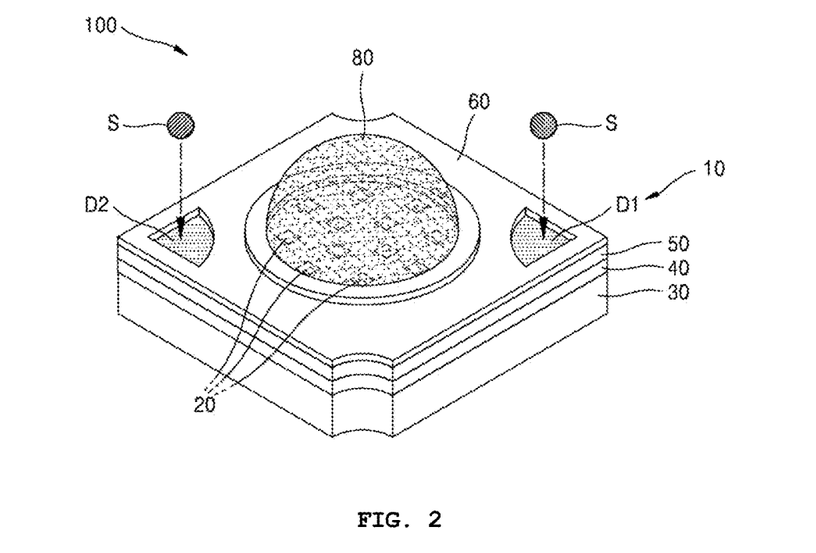
FIG. 2 is an assembled perspective view of the component of the light emitting module of FIG. 1.

FIG. 1 is an exploded perspective view of a component illustrating a light emitting module 100 according to exemplary embodiments of the present invention. Further, FIG. 2 is an assembled perspective view of the component of the light emitting module 100 of FIG. 1, FIG. 3 is a plan view illustrating an electrode layer 10 of the light emitting module 100 of FIG. 1, and FIG. 4 is a cross-sectional view of the light emitting module 100 of FIG. 1.

First, as illustrated in FIGS. 1 to 4, a light emitting module 100 according to exemplary embodiments of the present invention may include an electrode layer 10, a light emitting element 20, a metal substrate 30, an insulating layer 40, a charging member 50, a reflection layer 60, a guide part 70, and a lens or a phosphor 80.

For example, the light emitting module 100 according to exemplary embodiments of the present invention illustrated in FIGS. 1 to 4 is illustrated for explanation, and components and functions thereof are not limited to the drawings. For example, as illustrated in FIGS. 1 to 4, the electrode layer 10 may include a plurality of blocks B insulated from each other by an electrode separating line L. More particularly, for example, another neighboring block B2 may be disposed in a first direction and still another neighboring block B5 may be disposed in a second direction different from the first direction, based on any one block B1 of the blocks B while having the electrode separating line L therebetween, so that heat generated from the light emitting element 20 may be emitted through the blocks B.

Figure 3:
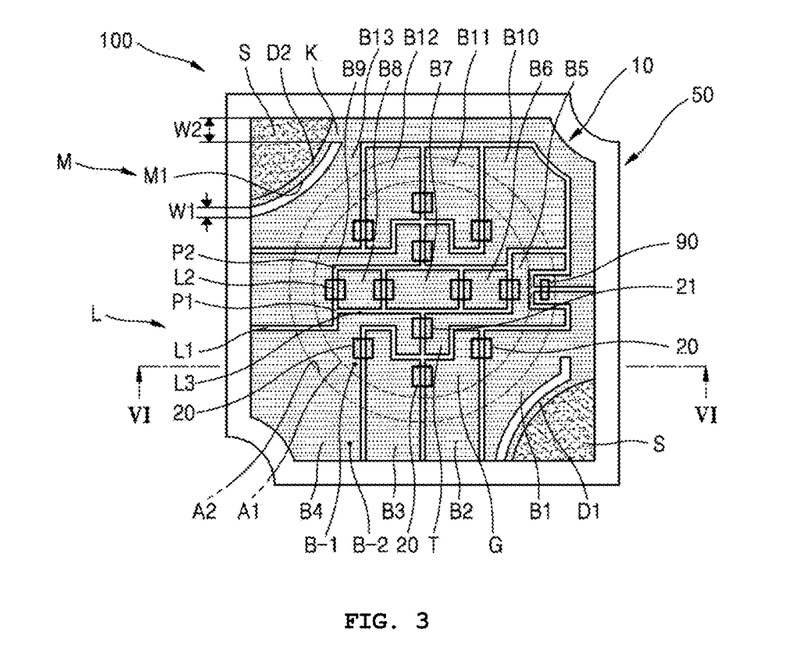
FIG. 3 is a plan view illustrating an electrode layer of the light emitting module of FIG. 1.
Figure 4:
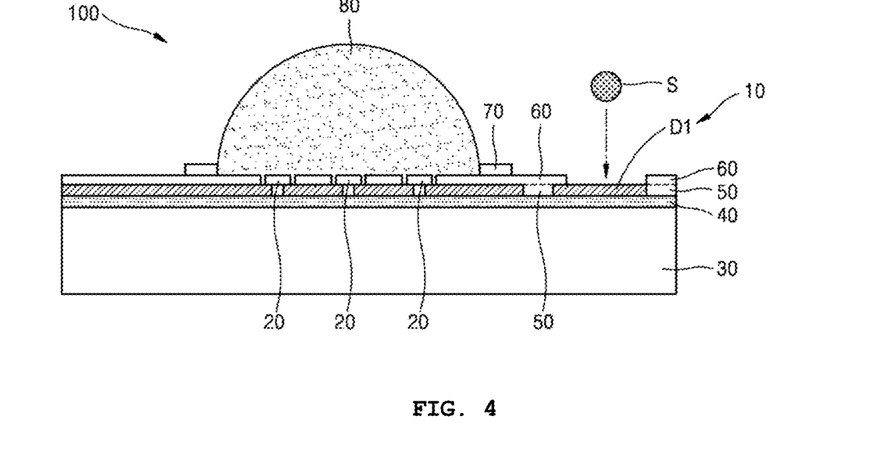
FIG. 4 is a cross-sectional view of the light emitting module of FIG. 1.

For example, as illustrated in FIG. 3, another neighboring block B2 may be disposed in a first direction based on the block B1, that is, a left direction, and still another neighboring block B5 may be disposed in a second direction based on the block B1, that is, a front.

Further, as illustrated in FIGS. 1 to 4, a plurality of light emitting elements 20 may be mounted on the electrode layer 10 so as to be electrically connected to any one block B1 of the blocks B of the electrode layer 10 and a neighboring block B2, respectively. Accordingly, a first light emitting element electrically connected to the block B1 and the neighboring block B2, for example, and a second light emitting element electrically connected to the block B2 and a neighboring block B3 may be connected in series with each other.

Further, for example, the first light emitting element and the second light emitting element may be electrically connected to any one block B1 of the blocks B of the electrode layer 10 and the neighboring block B2, respectively, so as to be connected in parallel to each other.

Further, by appropriately connecting the blocks B to each other, the light emitting elements 20 electrically connected to the respective blocks B may also be generally connected in parallel to each other.

For example, the block B1 electrically connected to a solder pad D1 of a negative (−) terminal may be electrically connected to the block B3, and the block B2 may be electrically connected to a solder pad D2 of a positive (+) terminal. Accordingly, for example, the first light emitting element is electrically connected to the block B1 and the block B2 and the second light emitting element having an electrode direction different from that of the first light emitting element is electrically connected to the block B2 and the block B3, such that the first light emitting element and the second light emitting element may be eventually connected in parallel to each other.

Further, for example, the block B1 electrically connected to the solder pad D1 of the negative (−) terminal may be electrically connected to the block B3, and a block B4 electrically connected to the solder pad D2 of the positive (+) terminal may be electrically connected to the block B2. Accordingly, for example, the first light emitting element is electrically connected to the block B1 and the block B2 and the second light emitting element having the same electrode direction as that of the first light emitting element is electrically connected to the block B3 and the block B4, such that the first light emitting element and the second light emitting element may be eventually connected in parallel to each other.

Further, for example, the block B1 electrically connected to the solder pad D1 of the negative (−) terminal may be electrically connected to the block B3, and the block B4 electrically connected to the solder pad D2 of the positive (+) terminal may be electrically connected to the block B2. Accordingly, for example, the first light emitting element is electrically connected to the block B1 and the block B2, the second light emitting element having the electrode direction different from that of the first light emitting element is electrically connected to the block B2 and the block B3, and a third light emitting element having the same electrode direction as that of the first light emitting element is electrically connected to the block B3 and the block B4, such that the first light emitting element, the second light emitting element, and the third light emitting element may be eventually connected in parallel to each other.

For example, as illustrated in FIGS. 1 to 4, the light emitting element 20 may be a light emitting diode (LED) of a flip chip form that is bonded on the electrode layer 10 using a first pad and a second pad and electrically connected thereto. Meanwhile, although not illustrated, the light emitting element 20 may also be a flip chip form having a signal transfer medium such as a bump, a solder, or the like, in addition to the pads. Besides, a light emitting element in which a bonding wire is applied to a terminal, or the bonding wire is partially applied to only a first terminal or a second terminal, a horizontal light emitting element, a vertical light emitting element, and the like may be all applied.

Meanwhile, as illustrated in FIG. 3, for example, the electrode separating line L may start from the outermost surface of the electrode layer 10 with one branch L1, internally lead to the electrode layer 10, pass through one or more branch points P1 branched into two branches L2 and L3 or one or more right-angled bending points P2 which are bent at an angle of 90°, traverse the electrode layer 10, and lead to the outermost other surface of the electrode layer 10.

Accordingly, as illustrated in FIG. 3, the block B2 of the electrode layer 10 may be formed as a fitting-type block in which a concave region G is formed to correspond to a protrusion region T of another neighboring block B5 in a shape fit into the protrusion region T, using the branch points P1 and the bending points P2.

Thus, as illustrated in FIGS. 1 to 4, since the electrode layer 10 is formed of a plurality of blocks B formed in a form fit to each other, a heat dissipation area may be maximized. Thereby, heat dissipation performance of a product is improved, thereby making it possible to implement the product capable of implementing high output and high heat dissipation.

Meanwhile, as illustrated in FIGS. 1 to 4, the electrode layer 10 may further include a first solder pad part D1 connected to a front block B1 of the blocks B and bonded to a solder member S, and a second solder pad part D2 connected to a terminal block B13 of the blocks B and bonded to the solder member S.

Here, as illustrated in FIG. 3 in detail, in order to prevent a solder spread defect phenomenon due to rapid heat emission into the blocks B at the time of welding the solder member S, an isolation part M formed between the first solder pad part D1 and the front block B1 or between the second solder pad part D2 and the terminal block B13, and having a shape of a slot partially spaced in the remaining portion except for an electrode connecting part K for electricity transfer may be formed.

More particularly, for example, as illustrated in FIG. 3, the isolation part M may be a narrow-width circular arc type M1 generally having a circular arc shape and having an interval narrower than a length in a length direction.

Accordingly, as illustrated in FIGS. 3 and 4, for example, due to the isolation part M between the first solder pad part D1 and the front block B1, most of the heat may not be transferred to the front block B1 and only some of the heat which are partially limited may be transferred through only the electrode connecting part K.

Figure 5:
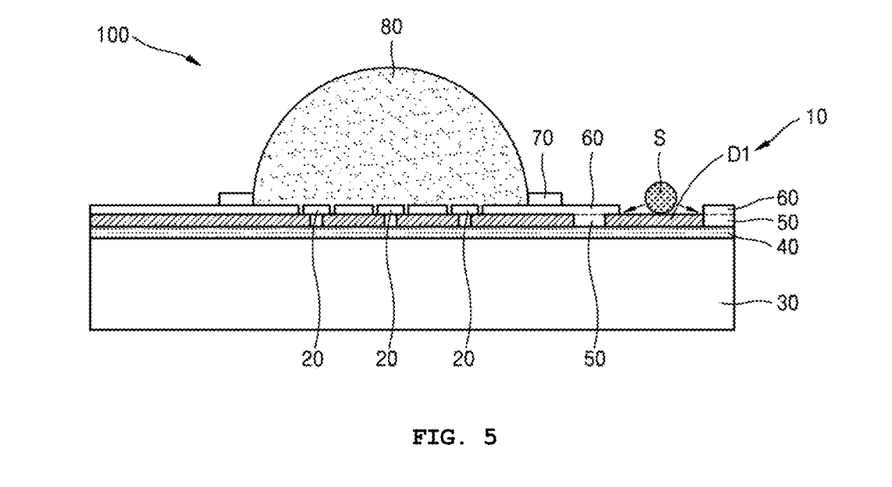
FIG. 5 is a cross-sectional view illustrating a soldering state of the light emitting module of FIG. 4.
Figure 6:
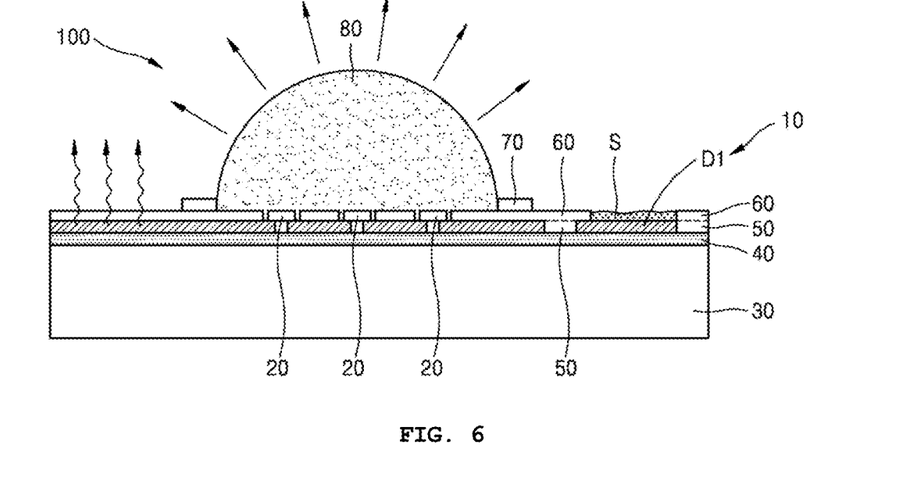
FIG. 6 is a cross-sectional view illustrating a solder spread state of the light emitting module of FIG. 4.

FIG. 5 is a cross-sectional view illustrating a soldering state of the light emitting module 100 of FIG. 4 and FIG. 6 is a cross-sectional view illustrating a solder spread state of the light emitting module 100 of FIG. 4.

Thus, first, as illustrated in FIG. 5, when the solder member S of a high temperature is in contact with the first solder pad part D1 to start soldering, most of the heat may not be transferred due to the isolation part M installed between the first solder pad part D1 and the front block B1. As a result, the heat may be isolated in the first solder pad part D1 to maintain a high temperature state. Thereby, the solder member S may be evenly melted and spread on the first solder pad part D1 in the high temperature state.

That is, the heat of the first solder pad part D1 and the second solder pad part D2 transferred to the neighboring blocks B, particularly, the blocks B1 and B13 are partially blocked using the isolation part M, thereby making it possible to prevent a conventional solder spread defect phenomenon that the solder member S is not evenly spread and is only partially coagulated, and the heat transferred to the blocks B at the time of performing soldering work for a long time is minimized, thereby making it possible to greatly improve reliability and durability of the product.

Here, as illustrated in FIG. 3, in order to block the heat, as an interval W1 of the isolation part M is wider, heat insulation performance may be increased, while in order to allow the blocks B to emit the heat generated from the light emitting elements 20, as the interval W1 of the isolation part M is narrower, heat dissipation performance may be increased. Therefore, as a result of experimentally deriving optimal numerical values having excellent heat insulation performance and excellent heat dissipation performance at the same time while changing the intervals W1, the interval W1 of the isolation part M may be 0.1 mm to 2.0 mm, may be preferably 0.2 mm to 1.9 mm, may be more preferably 0.3 mm to 1.8 mm, may be more preferably 0.4 mm to 1.7 mm, may be more preferably 0.5 mm to 1.6 mm, may be more preferably 0.6 mm to 1.5 mm, may be more preferably 0.7 mm to 1.4 mm, may be more preferably 0.6 mm to 1.5 mm, may be more preferably 0.7 mm to 1.4 mm, may be more preferably 0.8 mm to 1.3 mm, may be more preferably 0.9 mm to 1.2 mm, and may be more preferably 1.0 mm to 1.1 mm.

Further, as illustrated in FIG. 3, in order to block the heat, as a width W2 of the electrode connecting part K is thinner, heat insulation performance may be increased, while in order to allow at least electricity to stably flow through the electrode connecting part K, the width W2 of the electrode connecting part K is wider, conductivity may be increased. Therefore, as a result of experimentally deriving optimal numerical values having excellent heat insulation performance and excellent conductivity at the same time while changing the intervals W2, the interval W2 of the electrode connecting part K may be 0.1 mm to 2.5 mm, may be preferably 0.2 mm to 2.4 mm, may be more preferably 0.3 mm to 2.3 mm, may be more preferably 0.4 mm to 2.2 mm, may be more preferably 0.5 mm to 2.1 mm, may be more preferably 0.6 mm to 2.0 mm, may be more preferably 0.7 mm to 1.9 mm, may be more preferably 0.8 mm to 1.8 mm, may be more preferably 0.9 mm to 1.7 mm, may be more preferably 1.0 mm to 1.6 mm, may be more preferably 1.1 mm to 1.5 mm, and may be more preferably 1.2 mm to 1.4 mm.

Meanwhile, for example, as illustrated in FIGS. 3 and 4, the solder pad parts D1 and D2 may have a quarter-circular arc shape having a corner as a center. According to specific example of the present invention, a radius of the solder pad part, which is the quarter-circular arc shape, may be 2.5 mm to 7.0 mm, may be preferably 2.6 mm to 6.5 mm, may be more preferably 2.8 mm to 6.2 mm, may be more preferably 3.0 mm to 6.0 mm, may be more preferably 3.2 mm to 5.6 mm, may be more preferably 3.4mm to 5.2mm, may be more preferably 3.6 mm to 5.0 mm, may be more preferably 3.8 mm to 4.8 mm, may be more preferably 4.0 mm to 4.6 mm, and may be more preferably 4.2 mm to 4.4 mm.

Meanwhile, for example, as illustrated in FIG. 3, the electrode layer 10 may include a central region A1 on which the plurality of light emitting elements 20 are intensively mounted and a border region A2 surrounding around the central region A1, and the block B may include a heat absorbing part B-1 positioned on the central region A1 and a heat dissipating part B-2 extended from the heat absorbing part B-1 and led to the border region A2.

As a result, as illustrated in FIGS. 3 and 6, the blocks B may absorb the heat generated from the light emitting elements 20 using the heat absorbing part B-1 positioned on the central region A1, and may rapidly emit the heat to the outside using the heat dissipating part B-2 led to the border region A2.

In order to rapidly emit the heat of the central region A1 to the border region A2 using the blocks B as described above, the blocks B may be disposed in a zigzag shape.

More particularly, for example, as illustrated in FIG. 3, the blocks B of the electrode layer 10 may include a first column blocks B1, B2, and B3 starting from the first solder pad part D1 and disposed in a first column, a second column blocks B4 and B5 connected to the first column of the first column blocks B1, B2, and B3 and disposed in a second column, a third column blocks B6, B7, and B8 connected to the second column of the second column blocks B4 and B5 and disposed in a third column, a fourth column blocks B9 and B10 connected to the third column of the third column blocks B6, B7, and B8 and disposed in a fourth column, and a fifth column blocks B11, B12, and B13 connected to the fourth column of the fourth column blocks B9 and B10 and disposed in a fifth column, so that electricity may flow in a zigzag through the plurality of light emitting elements 20 from the first solder pad part D1 and may then flow into the second solder pad part D2.

That is, as illustrated in FIG. 3, the electrode layer 10 may be formed of a total of 13 blocks B arranged in a zigzag. Further, for example, a zener diode 90 or a transient voltage suppressor (TVS) may be installed between the front block B1 and the terminal block B13.

However, the zigzag arrangement configuration of the electrode layer 10 or the zener diode 90 is not necessarily limited to the drawings, and may be modified or changed within a scope without departing from a technical sprit of the present invention. For example, the electrode layer 10 may be configured in two or more columns or the zener diode 90 may also be omitted.

Meanwhile, as illustrated in FIGS. 1 to 4, the light emitting module 100 according to exemplary embodiments of the present invention may further include a metal substrate 30 supporting the electrode layer 10, an insulating layer 40 installed on the metal substrate 30, a charging member 50 charged in the electrode separating line L of the electrode layer 10, a reflecting layer 60 having a light emitting element accommodating hole H1 and a solder pad hole H2 formed therein and formed on the electrode layer 10, and a guide part 70 formed on the reflecting layer 60 and formed around the light emitting element accommodating hole H1 to guide a position of the lens or the phosphor 80 at the time of forming the lens or the phosphor 80, in addition to the electrode layer 10 and the light emitting elements 20 described above.

More particularly, the metal substrate 30 may be formed of an aluminum or aluminum alloy material having excellent thermal conductivity. Further, the insulating layer 40 may include a T-preg insulating member of a film form, which is one of PCB materials. Further, the charging member 50 and the reflecting member 60 may include a white photoimageable solder resist (PSR), which is the same material as each other.

Here, for example, the charging member 50 may be primarily formed between the electrode separating lines L by using a squeeze printing method for the white PSR, and subsequently, the reflecting member 60 may be secondarily formed by coating and molding the white PSR on the electrode layer 10. Further, the guide part 70 may be a step part formed of a silicon material formed in a ring shape.

However, a shape, a material, or a kind of metal substrate 30, insulating layer 40, charging member 50, reflecting layer 60, and lens or phosphor 80 may be very variously applied, and is not necessarily limited to the drawings.

Figure 7:
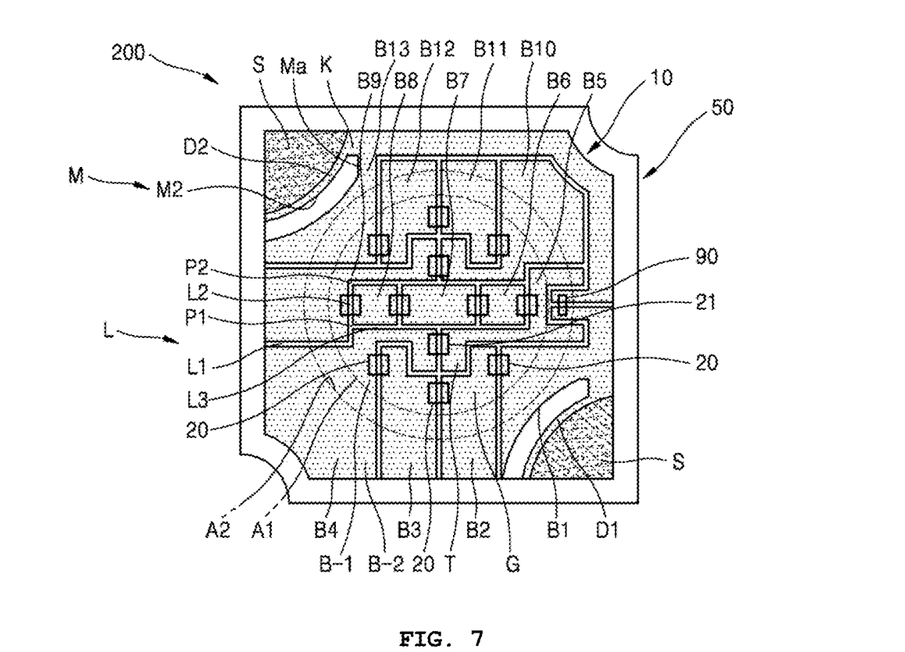
FIG. 7 is a plan view illustrating a light emitting module according to another exemplary embodiment of the present invention.

FIG. 7 is a plan view illustrating a light emitting module 200 according to another exemplary embodiment of the present invention.

As illustrated in FIG. 7, an isolation part M of the light emitting module 200 according to another exemplary embodiment of the present invention may be a broad-width circular arc type M2 generally having a circular arc shape, and of which an inter side end portion is formed in a straight line type Ma so as to widen an interval thereof. As a result, as a length of the straight line type Ma is increased, the interval thereof is widened, thereby making it possible to improve heat insulation.

Figure 8:
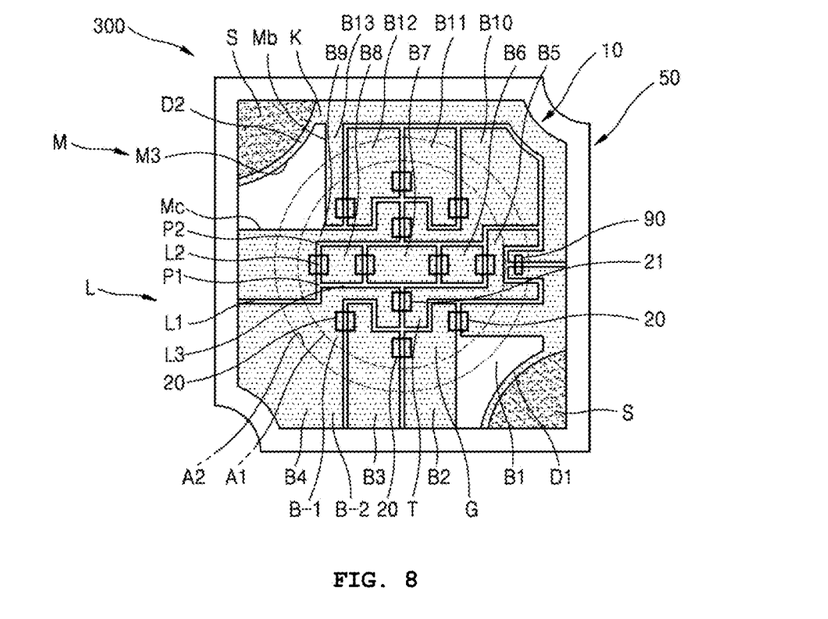
FIG. 8 is a plan view illustrating a light emitting module according to still another exemplary embodiment of the present invention.

FIG. 8 is a plan view illustrating a light emitting module 300 according to still another exemplary embodiment of the present invention.

As illustrated in FIG. 8, an isolation part M of the light emitting module 300 according to still another exemplary embodiment of the present invention may be a partial circular arc type M3 partially having a circular arc shape, and in which a first straight line part Mb and a second straight line part Mc are formed to widen an interval thereof. As a result, as a length of the first straight line part Mb and the second straight line part Mc is increased, the interval thereof is widened, thereby making it possible to improve heat insulation.

Figure 9:
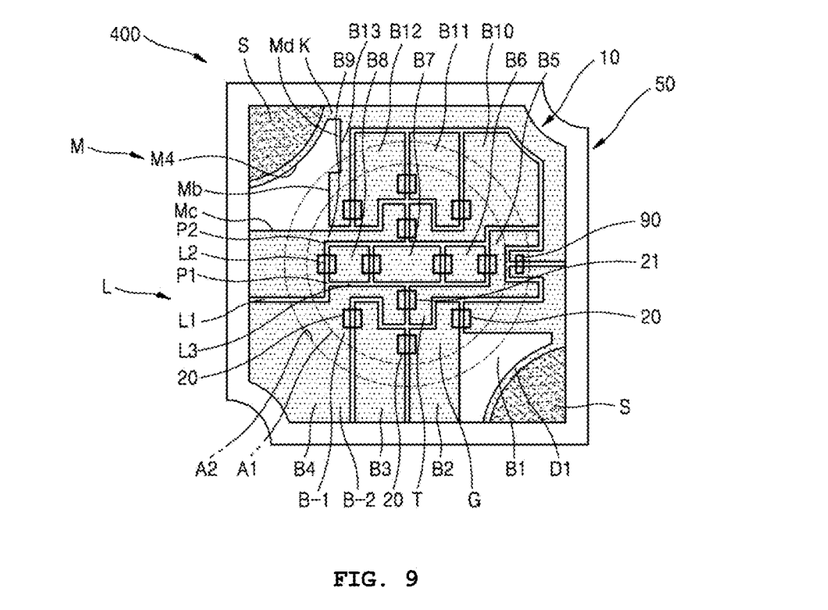
FIG. 9 is a plan view illustrating a light emitting module according to still another exemplary embodiment of the present invention.

FIG. 9 is a plan view illustrating a light emitting module 400 according to still another exemplary embodiment of the present invention.

As illustrated in FIG. 9, an isolation part M of the light emitting module 400 according to still another exemplary embodiment of the present invention may be a partial circular arc extension type M4 partially having a circular arc shape, and in which a first straight line part Mb and a second straight line part Mc are formed to widen an interval thereof and an extension part Md having a shape extended to the first straight line part Mb in one direction thereof is formed. As a result, as a length or a shape of the first straight line part Mb, the second straight line part Mc, and the extension part Md is adjusted, thereby making it possible to maximally improve heat insulation even in a limited space.

Figure 10:
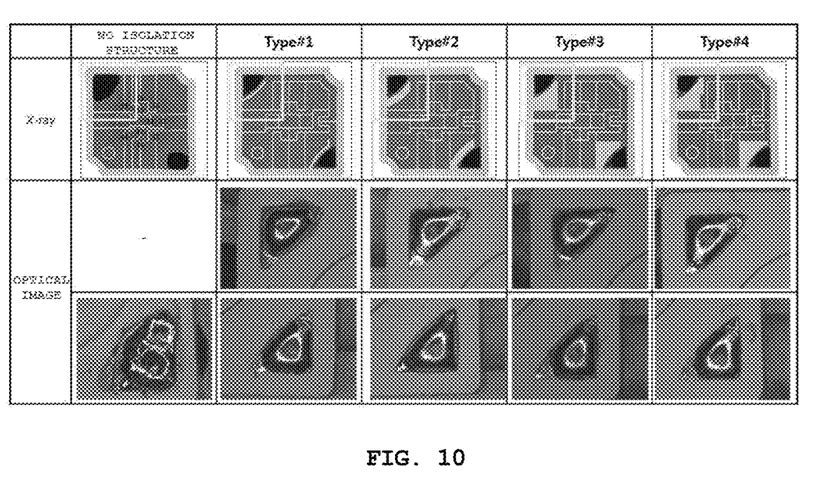
FIG. 10 is a comparison table illustrating results obtained by comparing photographs of solder spread states of the light emitting modules according to the related art and exemplary embodiments of the present invention.

FIG. 10 is a comparison table illustrating results obtained by comparing photographs of solder spread states of a light emitting module according to the related art and light emitting modules TYPE#1, TYPE#2, TYPE#3, and TYPE#4 according to exemplary embodiments of the present invention.

As illustrated in FIG. 10, when comparing photographs of solder spread states of a light emitting module (no isolation structure) according to the related art and light emitting modules TYPE#1, TYPE#2, TYPE#3, and TYPE#4 according to exemplary embodiments of the present invention, it may be seen that the light emitting module (no isolation structure) according to the related art appears very dirty because the solder member is partially lumped, while the light emitting modules TYPE#1, TYPE#2, TYPE#3, and TYPE#4 according to exemplary embodiments of the present invention have flat and regular shapes in both upper and lower photographs because the solder member is relatively uniformly spread, as photographed in optical image portions of FIG. 10.

Meanwhile, although not illustrated, the present invention may provide a lighting device or a display device including the light emitting modules 100, 200, 300, and 400 described above. Here, components of the lighting device or the display device according to an exemplary embodiment of the present invention may have the same configuration and function as those of the light emitting element package according to the present invention described above. Therefore, a detailed description thereof will be omitted.

According to the exemplary embodiments as described above, the heat dissipation performance may be improved to produce a high output and high performance product, the solder spread defect phenomenon may be prevented and wiring defect or other soldering defects may be prevented to improve productivity, and the heat transferred to the light emitting element may be minimized to greatly improve reliability and durability of the product. Of course, a scope of the present invention is not limited to the above-mentioned effects.

Although the present invention has been described with reference to the exemplary embodiments shown in the accompanying drawings, it is only an example. It will be understood by those skilled in the art that various modifications and equivalent other exemplary embodiments are possible from the present invention. Accordingly, the actual technical protection scope of the present invention is to be determined by the spirit of the appended claims.

What is claimed is:

1. A light emitting module comprising:
an electrode layer including a plurality of blocks that are insulated from each other by an electrode separating line; and
one or more light emitting elements mounted on the electrode layer so as to be electrically connected to any one block of the blocks of the electrode layer and a neighboring block, respectively,
wherein the blocks have another neighboring block disposed in a first direction and still another neighboring block disposed in a second direction, based on any one block of the blocks while having the electrode separating line therebetween so that heat generated from the light emitting elements is emitted through the blocks.

2. The light emitting module of claim 1, wherein the electrode separating line starts from the outermost surface of the electrode layer with one branch, internally leads to the electrode layer, passes through one or more branch points branched into two branches, traverses the electrode layer, and leads to the outermost other surface of the electrode layer.

3. The light emitting module of claim 1, wherein the electrode separating line starts from the outermost surface of the electrode layer, internally leads to the electrode layer, passes through one or more right-angled bending points which are bent at an angle of 90°, traverses the electrode layer, and leads to the outermost other surface of the electrode layer.

4. The light emitting module of claim 1, wherein the block of the electrode layer is a fitting-type block in which a concave region is formed to correspond to a protrusion region of another neighboring block in a shape fit into the protrusion region.

5. The light emitting module of claim 1, wherein the electrode layer further includes:
a first solder pad part connected to a front block of the blocks and having a solder member bonded thereto; and
a second solder pad part connected to a terminal block of the blocks and having the solder member bonded thereto, and
an isolation part is formed between the first solder pad part and the front block or between the second solder pad part and the terminal block, and is partially formed in the remaining portion except for an electrode connecting part for electricity transfer, in order to prevent a solder spread defect phenomenon due to rapid heat emission at the time of welding the solder member.

6. The light emitting module of claim 5, wherein the isolation part is formed by selecting any one of a narrow-width circular arc type generally having a circular arc shape and having an interval narrower than a length in a length direction, a broad-width circular arc type generally having a circular arc shape, and of which an inter side end portion is formed in a straight line type so as to widen an interval thereof, a partial circular arc type partially having a circular arc shape, and in which a first straight line part and a second straight line part are formed to widen an interval thereof, and a partial circular arc extension type partially having a circular arc shape, and in which a first straight line part and a second straight line part are formed to widen an interval thereof and an extension part having a shape extended to the first straight line part in one direction thereof is formed.

7. The light emitting module of claim 5, wherein the isolation part has an interval of 0.1 mm to 2.0 mm, and
the electrode connecting part has an interval of 0.1 mm to 2.5 mm.

8. The light emitting module of claim 5, wherein the blocks of the electrode layer include first column blocks starting from the first solder pad part and disposed in a first column; and second column blocks connected to the first column of the first column blocks and disposed in a second column, so that electricity flows in a zigzag through the plurality of light emitting elements from the first solder pad part and then flows into the second solder pad part.

9. The light emitting module of claim 1, wherein the electrode layer includes a central region on which the plurality of light emitting elements are intensively mounted and a border region surrounding around the central region, and
the block includes a heat absorbing part positioned on the central region and a heat dissipating part extended from the heat absorbing part and led to the border region.

10. The light emitting module of claim 1, further comprising:
a metal substrate supporting the electrode layer;
an insulating layer installed on the metal substrate;
a charging member charged in the electrode separating line of the electrode layer;
a reflecting layer having a light emitting element accommodating hole and a solder pad hole formed therein and formed on the electrode layer; and
a guide part formed on the reflecting layer and formed around the light emitting element accommodating hole to guide a position of a lens or phosphor at the time of forming the lens or the phosphor.

11. A lighting device comprising:
an electrode layer including a plurality of blocks that are insulated from each other by an electrode separating line; and
one or more light emitting elements mounted on the electrode layer so as to be electrically connected to any one block of the blocks of the electrode layer and a neighboring block, respectively,
wherein the blocks have another neighboring block disposed in a first direction and still another neighboring block disposed in a second direction, based on any one block of the blocks while having the electrode separating line therebetween so that heat generated from the light emitting elements is emitted through the blocks.

12. The light emitting module of claim 1, further comprising two or more light emitting elements mounted on the electrode layer so as to be electrically connected to any one block of the blocks of the electrode layer and a neighboring block, respectively,
wherein the light emitting elements are electrically connected in series with or in parallel to each other.

* * * * *